US009408329B2

(12) United States Patent
Iyengar et al.

(10) Patent No.: US 9,408,329 B2
(45) Date of Patent: Aug. 2, 2016

(54) SERVER DEVICE COOLING SYSTEM

(71) Applicant: Facebook, Inc., Menlo Park, CA (US)

(72) Inventors: Madhusudan Krishnan Iyengar, Foster City, CA (US); Jacob Na, Los Gatos, CA (US)

(73) Assignee: FACEBOOK, INC., Menlo Park, CA (US)

( * ) Notice: Subject to any disclaimer, the term of this patent is extended or adjusted under 35 U.S.C. 154(b) by 218 days.

(21) Appl. No.: 14/231,041

(22) Filed: Mar. 31, 2014

(65) Prior Publication Data

US 2015/0282389 A1    Oct. 1, 2015

(51) Int. Cl.
*G06F 1/20* (2006.01)
*H05K 5/00* (2006.01)
*H05K 7/20* (2006.01)

(52) U.S. Cl.
CPC ........ *H05K 7/20636* (2013.01); *H05K 7/20563* (2013.01)

(58) Field of Classification Search
CPC ............ H05K 7/20636; H05K 7/20563
USPC ............ 361/679.46–679.54, 688–723; 454/84–186, 188–193, 228–368; 165/80.1–80.5, 104.11–104.34, 185
See application file for complete search history.

(56) References Cited

U.S. PATENT DOCUMENTS

| | | | | |
|---|---|---|---|---|
| 6,234,240 B1 * | 5/2001 | Cheon | ............. | F28D 15/00 165/185 |
| 2007/0133172 A1 * | 6/2007 | Cheon | ............. | G06F 1/20 361/699 |
| 2007/0274043 A1 * | 11/2007 | Shabany | ............. | H05K 7/20645 361/696 |
| 2007/0295492 A1 * | 12/2007 | Sharp | ............. | F28D 1/0477 165/151 |
| 2008/0017360 A1 * | 1/2008 | Campbell | ............. | F28F 1/32 165/148 |
| 2008/0084667 A1 * | 4/2008 | Campbell | ............. | H05K 7/20772 361/702 |
| 2010/0097758 A1 * | 4/2010 | Franz | ............. | H05K 7/20145 361/694 |
| 2011/0277967 A1 * | 11/2011 | Fried | ............. | F28D 15/0266 165/104.26 |
| 2012/0111533 A1 * | 5/2012 | Chen | ............. | H05K 7/20736 165/80.2 |
| 2013/0021746 A1 * | 1/2013 | Campbell | ............. | H05K 7/20145 361/679.47 |

* cited by examiner

*Primary Examiner* — Anthony Haughton
*Assistant Examiner* — Yahya Ahmad
(74) *Attorney, Agent, or Firm* — Keller Jolley Preece

(57) ABSTRACT

The principles described herein provide a server device having a cooling system that provides an efficient cooling of server device components. The cooling system can include a radiator block having air passageways that are oriented substantially orthogonal to the initial airflow path direction. In addition, the server device can include one or more baffles that create an airflow path that passes through the radiator block multiple times. Moreover, the server device can include various additional features that provide convenient access to electronic components within the server device without diminishing the effectiveness of the cooling system.

19 Claims, 7 Drawing Sheets

SERVER DEVICE COOLING SYSTEM

BACKGROUND

1. Technical Field

One or more embodiments of the present disclosure generally relate to systems and devices for cooling computing devices. More specifically, one or more embodiments of the present disclosure relate to server cooling systems and devices.

2. Background and Relevant Art

Conventional server systems often include various server devices operating in a compact space. Each of the server devices can have multiple components (e.g., processors, memory, storage) that may operate for long periods of time and process large amounts of data. During operation, server device components may often generate unwanted amounts of heat. Unregulated, the generated heat can reduce processing efficiency and/or cause permanent damage due to the overheating of components within a server device. To regulate component temperature, a server device typically includes a cooling system to increase processing efficiency and to prevent the server device components from overheating. Thus, cooling systems can protect the server device components, as well as increase the efficiency of the server device.

Conventional cooling systems, however, suffer from a number of limitations and drawbacks. For example, space constraints inherent to most server devices complicate efforts to cool server device components due to the compact nature of the server device. For example, traditional cooling systems can include a fan that, because of space limitations, is small and/or poorly located. An undersized or poorly positioned fan may not ensure efficient and effective air circulation throughout the server device.

The lower efficiency of many conventional cooling systems can reduce the efficiency of the entire server device. For example, the lower the efficiency of the cooling system for a server device, the lower the amount of heat the cooling system is able to extract from the server device. In many instances, therefore, the limitations of conventional cooling systems also limit the performance of the server device itself. For instance, due to the limited amount of heat that a conventional cooling system can extract from a server device, the processors and other components of the server device are limited to operating below a maximum performance level.

Due to the poor cooling efficiency of many conventional cooling systems, as described above, other conventional cooling systems include larger cooling devices (e.g., larger fan) and/or multiple cooling devices to increase the capabilities of the cooling system. Adding larger devices or additional devices, however, may cause additional disadvantages. For example, increasing the size of one or more cooling devices can cause additional space constraints within the server device, thereby decreasing the space available to provide the volumetric flow rate of air needed for efficient cooling of the server device components. In addition, increasing the size or adding additional cooling devices to a server device may increase the overall size of the server device, which in turn decreases the number of server devices that can be used within a given space (e.g., server room).

Moreover, due to the complexity of conventional cooling systems, a technician may have difficulty performing maintenance on the server device. For example, typical server devices may become so crowded by the cooling system that significant time is needed to remove or reposition the cooling system devices to allow the technician to replace or upgrade the sever device components. The additional time a technician needs to perform server device maintenance and/or upgrade server device components may lead to longer server device down times in the event of a component failure, and increases operating cost of the sever device in general.

Accordingly, there are a number of considerations to be made in cooling server devices and systems.

BRIEF SUMMARY

The principles described herein provide benefits and/or solve one or more of the foregoing or other problems in the art with cooling systems for server devices. For example, one or more embodiments of a server device include air and liquid cooling systems that cooperatively operate to more efficiently cool a server device. In particular, one or more embodiments provide a server device having a cooling system designed to create an initial airflow path in a direction defined from an inlet toward an outlet of a server device. In one or more embodiments the cooling system can include a radiator block having air passageways that are oriented substantially orthogonal to the initial airflow path direction. The orientation of the radiator block can allow for a radiator block (e.g., heat exchanger) with a larger surface area, which in turn can increase the heat exchange efficiency of a cooling system.

In one or more additional embodiments, the server device can include one or more baffles that create an airflow path that passes through the radiator block multiple times. For example, the baffles can be positioned strategically between the inlet and the outlet so that as the airflows through the server device, an airflow path crosses back and forth across the radiator block. As the air passes through the radiator block several times, the amount of heat exchanged from the radiator per volume of air can increase, thus further increasing the heat exchange efficiency of the cooling system.

Furthermore, in accordance with one or more embodiments, a server device can provide convenient physical access to one or more components within the server device. For example, a server device can include a radiator block positioned to allow a technician to easily remove and/or displace the radiator block to gain physical access to one or more components within the server device. Alternatively, or in addition to, the radiator block, in combination with a side access door, can provide convenient access to the server device components. Facilitating convenient access to components within a server device enhances the ability to replace components within the server device, as well as identifying and troubleshooting problems related to the hardware of the server device in a time and cost effective manner.

Additional features and advantages of exemplary embodiments will be set forth in the description which follows, and in part will be obvious from the description, or may be learned by the practice of such exemplary embodiments. The features and advantages of such embodiments may be realized and obtained by means of the instruments and combinations particularly pointed out in the appended claims. These and other features will become more fully apparent from the following description and appended claims, or may be learned by the practice of such exemplary embodiments as set forth hereinafter.

BRIEF DESCRIPTION OF THE DRAWINGS

In order to describe the manner in which the above-recited and other advantages and features of the embodiments can be obtained, a more particular description of the principles briefly described above will be rendered by reference to specific embodiments thereof that are illustrated in the appended drawings. It should be noted that the figures are not drawn to scale, and that elements of similar structure or function are generally represented by like reference numerals for illustrative purposes throughout the figures. Understanding that these drawings depict only typical embodiments and are not therefore to be considered to be limiting of its scope, principles will be described and explained with additional specificity and detail through the use of the accompanying drawings.

DETAILED DESCRIPTION

Figure 1:
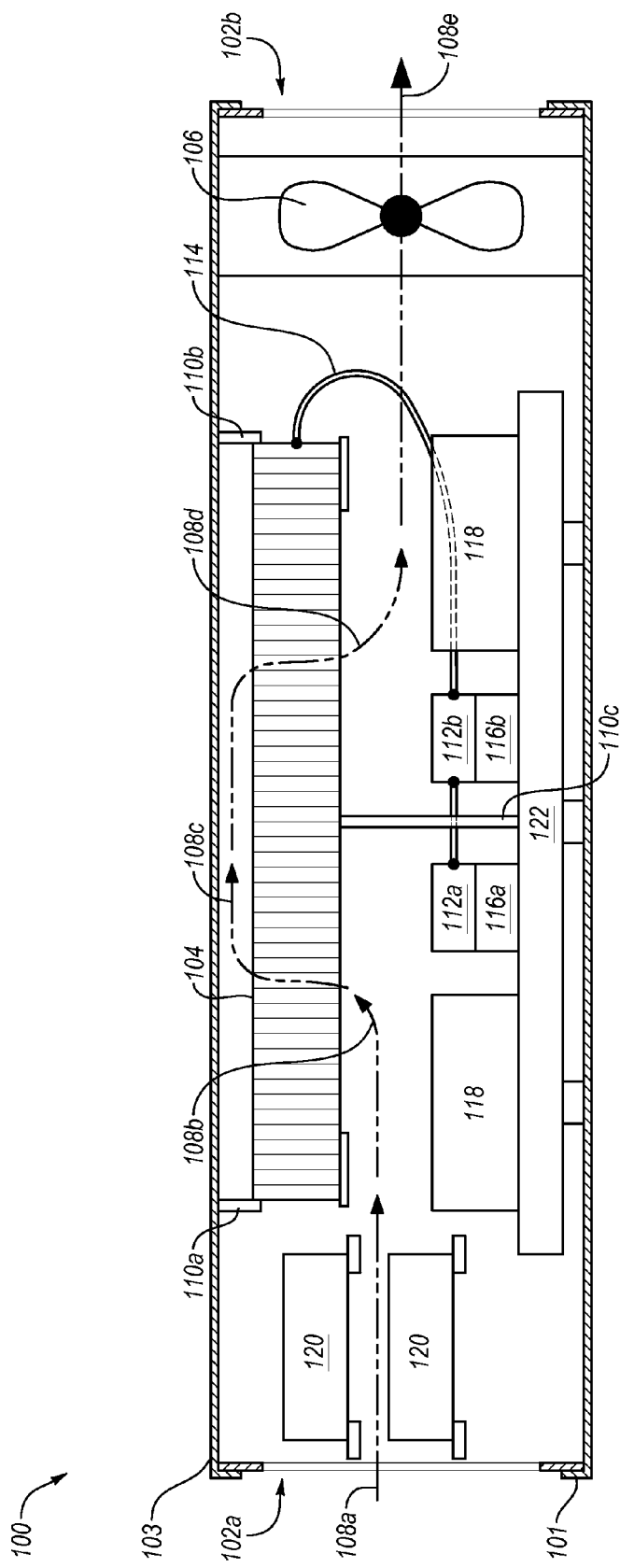
FIG. 1 illustrates a side schematic view of a server device in accordance with one or more embodiments described herein.

One or more embodiments described herein include a server device having a cooling system that provides efficient cooling of server device components, while at the same time providing a cooling system that provides convenient access to server device components. In particular, one or more cooling components of the cooling system can be strategically arranged to facilitate a more efficient interaction between elements of a cooling system, as well as increase the efficiency of individual cooling components. One or more embodiments of a server device described herein can include a radiator block (e.g., heat exchanger) having air passageways oriented substantially orthogonal to an initial airflow path. The orientation of the radiator block can allow the radiator block to be positioned lengthwise along a server device chassis, which in turn allows for a radiator block with a larger surface area. In addition, due to the orientation of the radiator block, in one or more embodiments the server device can include one or more baffles that create an airflow path through the server device. In particular, the one or more baffles can be used to create an airflow path that passes through the radiator block several times.

Using the principles described generally above, one or more embodiments of the server device allows for more efficient cooling of server device components. For example, the increased size of the radiator block provides more surface area on the radiator block with which airflow can interact. The larger surface area of the radiator block can facilitate a more efficient use of airflow per volume of air by increasing the amount of heat transfer between the radiator block and the airflow. An increased amount of heat transfer to the airflow provides for faster and more efficient cooling of the server device components.

In addition to the increased surface area of the radiator block, an airflow path that passes through the radiator block multiple times also can increase the amount of heat transfer between the radiator block and the airflow. In particular, each time the airflow passes through the radiator block, additional heat can be transferred from the radiator block to the airflow. The greater the amount of heat that can be transferred to the airflow per volume of air, the more efficient the cooling system of the server device.

In one or more embodiments, the airflow path can be strategically designed such that the coolest air interacts with the coolest portion of the radiator block (e.g., the first time the airflow passes through the radiator block) and the warmer air interacts with the warmest portion of the radiator block (e.g., the second time the airflow passes through the radiator block). In this way, the amount of heat transferred from the radiator block to the air can be increased for a particular volume of air. Therefore, due to the increased surface area and the multi-pass airflow path provided in accordance to principles described herein, a server device can include a cooling system having an increased cooling efficiency compared to conventional cooling systems.

Unlike other conventional cooling systems, and despite the increased performance of a cooling system as described herein, one more embodiments of the server device may also provide a cooling system that facilitates convenient access to components within the server device while maintaining the benefits provided by the cooling system. For example, in one or more embodiments the radiator block can rotate around a hinge to expose and/or provide easy access to components of the server device (e.g., memory cards, storage drives, processors). For instance, the radiator block may be connected to liquid cooling plates by way of liquid tubes that function as a hinge. Likewise, the radiator block may rotate about a pin hinge connected to the server chassis. Facilitating easy access to a server device by way of a rotating or displaceable radiator block allows for easy maintenance and/or replacement of components within the server device, while also maintaining the benefits of the increased cooling efficiency of the cooling system.

To further provide access to server device components, the server device can include one or more side openings that provide a technician access to server device components. For example, the radiator block can be oriented parallel to, and positioned a distance above, a motherboard to provide a technician ample space to access the components located on the motherboard through the side opening on the server device. Therefore, in one or more embodiments, a server device can include various features and characteristics that allow a technician to access components within the service device without having to remove and/or manipulate the cooling system to gain access.

As used herein, a "server device" (or simply "server") may include any computing device or collection of computing devices having components that generate heat. In one or more embodiments, a server device can include one or more computing devices. Additional examples of server devices include, but are not limited to, server systems, desktop computers, computing systems, and/or other electronic devices that make use of a cooling system for cooling electronic components.

As used herein, a "radiator block" may include any type of heat exchanger device used to transfer thermal energy from one medium to another. For example, a heat exchanger device can be used to transfer heat between a liquid and air, such as a radiator.

Exemplary systems and devices will now be described in reference to the drawings. For example, FIGS. 1-5 illustrate an example of a server device 100 in accordance with one or more principles described herein. In particular, FIG. 1 illustrates a side schematic view of a server device 100 in accordance with one or more embodiments. As illustrated in FIG. 1, the server device 100 may include a chassis 101. The chassis 101 can have an elongated rectangular box-type geometric configuration with an inlet 102a on a first end of the chassis 101 and an outlet 102b on a second end of the chassis 101, as shown in FIG. 1. In one configuration, air passes into the chassis 101 through the inlet 102a and exits the chassis 101 through the outlet 102b. In some embodiments, inlet air can enter the inlet 102a from a cold aisle of a server room, and outlet air can exit the outlet 102b into a hot aisle of a server room.

In one or more embodiments, the chassis 101 can be made from metal (e.g., steel (SECC—Steel, electrogalvanized, cold-rolled, coil), or aluminum). Alternatively, the chassis 101 can be made from plastics, or a combination of plastic and metal. In addition, some parts of the chassis 101 can be made from glass, or another transparent or translucent material that allows a technician to view the server device 100 components housed within the chassis 101 without having to remove a portion of the chassis 101.

The geometric configuration of the chassis 101 can vary from one embodiment to the next. For example, as illustrated in FIG. 1, the chassis 101 can have a substantially rectangular box configuration with a bottom panel and two sidewalls that, along with the inlet 102a and outlet 102b, form a box that contains one or more components of the server device. The chassis 101, however, can have various lengths, widths, and heights to form a chassis 101 having a geometric configuration and geometric dimensions as needed for a particular server device 100 application. In particular, the chassis 101 can have almost any geometric configuration that allows for an airflow path between an inlet 102a and an outlet 102b of the chassis.

Depending on the geometric configuration of the chassis 101, the position of the inlet 102a and the outlet 102b can vary. For example, as illustrated in FIG. 1, the inlet 102a and the outlet 102b are positioned on opposite sides of the chassis 101. In alternative configurations, however, the inlet 102a can be located on a side of the chassis 101 adjacent to the side of the outlet 102b. Additionally, the inlet 102a and/or the outlet 102b can be located on either the top (e.g., chassis cover 103) or bottom of the chassis 101, depending on the location of electronic components within the server device 100.

As mentioned briefly above, the chassis 101 may include a chassis cover 103 that extends across the top of the chassis 101 covering one or more components of the server device 100. The chassis cover 103 may extend across all or a portion of the chassis 101. For example, and as illustrated in FIG. 1, the chassis cover 103 may extend substantially between the inlet 102a and the outlet 102b of the chassis 101. Alternatively, the chassis cover 103 may extend only across a portion of the length of the chassis 101. For example, the chassis cover 103 may cover the radiator block 104 without extending over other components of the server device 100.

The chassis 101 can support or house some or all of the components of the server device 100. For example, in one or more embodiments, the chassis 101 can be used to support or house electronic components and cooling system components. In one or more embodiments, for example, the server device 100 can include one or more electronic components housed within the chassis 101. As illustrated in FIG. 1, for example, electronic components can include, but are not limited to, one or more processors 116a, 116b (e.g., CPUs), memory circuitry 118 (e.g., dual-inline memory modules (DIMM)), storage devices 120 (e.g., hard drives and peripheral component interconnect express (PCIE) circuitry), and one or more motherboards 122.

The number, type, and arrangement of the electronic components within the server device 100 can vary from one embodiment to the next. For example, the processors 116a, 116b and memory circuitry 118 can have various positions. Additionally, the storage devices 120 can have a different position within the chassis 101, other than as illustrated in FIG. 1. One skilled in the art will recognize that embodiments of the server device 100 are not limited to the number, type, and arrangement of electronic components illustrated in the figures, but rather the figures illustrate example configurations of electronic components. In particular, the principles described herein with respect to the cooling system are not dependent on the locations, positions, types, quantity, and arrangement of the electronic components.

As explained above, during the operation of the server device 100, one or more of the electronic components can produce heat. To protect the electronic components from overheating, and to increase the operating efficiency of the electronic components, the server device 100 can include a cooling system. In many server device 100 configurations, the processors 116a, 116b are the electronic components within the server device 100 that produce the most amount of heat. In addition, the processors 116a, 116b can be susceptible to efficiency decreases and overheating issues due to heat. Often, the processing efficiency and processing performance of the server device 100 is increases with an increases efficiency of the cooling system to transfer heat away from the processors 116a, 116b and out of the server device 100.

In one or more embodiments, to provide efficient cooling of the processors 116a, 116b, the cooling system can include cooling plates 112a, 112b that thermally couple to processors 116a, 116b, respectively, as illustrated in FIG. 1. For example, the cooling plates 112a, 112b can thermally couple to processors 116a, 116b by way of one or more thermal adhesives. Alternatively, the cooling plates 112a, 112b can be positioned on top of the processors 116a, 116b and mechanically attached to the motherboard 122. In any event, the thermal coupling between the cooling plates 112a, 112b and the processors 116a, 116b can minimize a thermal conductivity coefficient to allow the largest heat transfer possible between the processors 116a, 116b and the cooling plates 112a, 112b.

In order to allow the cooling plates 112a, 112b to continue to extract heat away from the processors 116a, 116b, a liquid cooling loop can use a liquid to transfer heat from the cooling plates 112a, 112b to the radiator 104. For example, and as illustrated in FIG. 1, the cooling plates 112a, 112b can be thermally coupled to the radiator 104 by way of liquid tubes 114. In general, the liquid cooling loop can facilitate the transfer of heat from the cooling plates 112 to the liquid (e.g., water), transport the heated liquid to the radiator block 104, and the radiator can dissipate the heat from the liquid, thus cooling the liquid. The cooled liquid can then return to the cooling plates 112a, 112b again and repeat the cycle.

In one or more embodiments, the cooling system can include one or more pumps for pumping cooling liquid throughout the liquid cooling loop. For example, one or more liquid pumps can facilitate the flow of cooling liquid through the cooling plates 112a, 112b, liquid tubes 114, and radiator block 104. The one or more pumps and the liquid tubes 114 can be arranged in a variety of configurations to provide various cooling characteristics or features. In one or more embodiments, a pump can directly attach to each of the cooling plates 112a, 112b. Alternatively, the pumps can be a standalone device positioned anywhere inline of the liquid cooling loop.

The cooling liquid can enter and exit the radiator block 104 by way of liquid tubes 114, as illustrated in FIG. 1. For example, one of the liquid tubes 114 can provide cooling liquid to the radiator block 104 carrying cooling liquid to have the radiator block 114 cool. In addition, another liquid tube 114 can receive cooling liquid from the radiator block 114 to pump back to one or more of the cooling plates 112a, 112b to cool the cooling plates 112a, 112b. Thus, cooling plates 112a, 112b can each have a cooling liquid inlet and a cooling liquid outlet. Additional features and advantages of various liquid cooling loop configurations are discussed further below with reference to FIG. 3.

As described above, the radiator block 104 can transfer heat out of the cooling liquid. Structurally, the radiator block 104 includes one or more flow paths that direct the cooling liquid through a series of cooling fins. For example, the radiator block 104 can have a bi-directional flow path configuration wherein cooling liquid enters a first chamber connected to a first set of flow paths that flow in a first direction. After flowing through the one or more flow paths, the cooling liquid can enter a second chamber. The second chamber can further couple with a second set of flow paths that flow in a second direction, opposite the first direction. The cooling liquid can then flow into a third chamber coupled to one or more liquid tubes 114, which return the flow of the cooling liquid back to one or more of the cooling plates 112a, 112b.

The radiator block 104 can have various flow path configurations. For example, instead of a bi-direction flow path configuration as described above, the radiator block can have a single direction flow path. In such a configuration, the liquid tubing 114 can provide the cooling liquid to a first end of the radiator block 104 and receive the cooling liquid from the second end of the radiator block. The radiator block 104 can include additional flow path configuration depending on the configuration of the server device 100.

In addition to flow path configurations through the cooling fins of the radiator block 104, the cooling fins can also have various configurations. For example, the number of cooling fins, the distance between the cooling fins, and the angle of the cooling fins can vary from one embodiment to the next. Additional details regarding the cooling fins will be explained further below with reference to FIGS. 5A-5B.

As described above, the radiator block 104 cooling fins facilitate heat transfer from the cooling liquid to air flowing through the radiator block. To create airflow through the radiator block 104, the server device 100 can include one or more fans 106. As illustrated in FIG. 1, for example, the fan 106 can be located proximate to the outlet 102b to create an airflow path 108 from the inlet 102a of the chassis 101 towards the outlet 102b of the chassis 101 (i.e., the airflow path illustrated by the combinations of arrows 108a-108e). In particular, the fan 106 pushes air out of the outlet 102b, thus creating a negative pressure within the server device 100 and causing air to enter the inlet 102a and flow through the server device 100 towards the outlet 102b.

Figure 3:
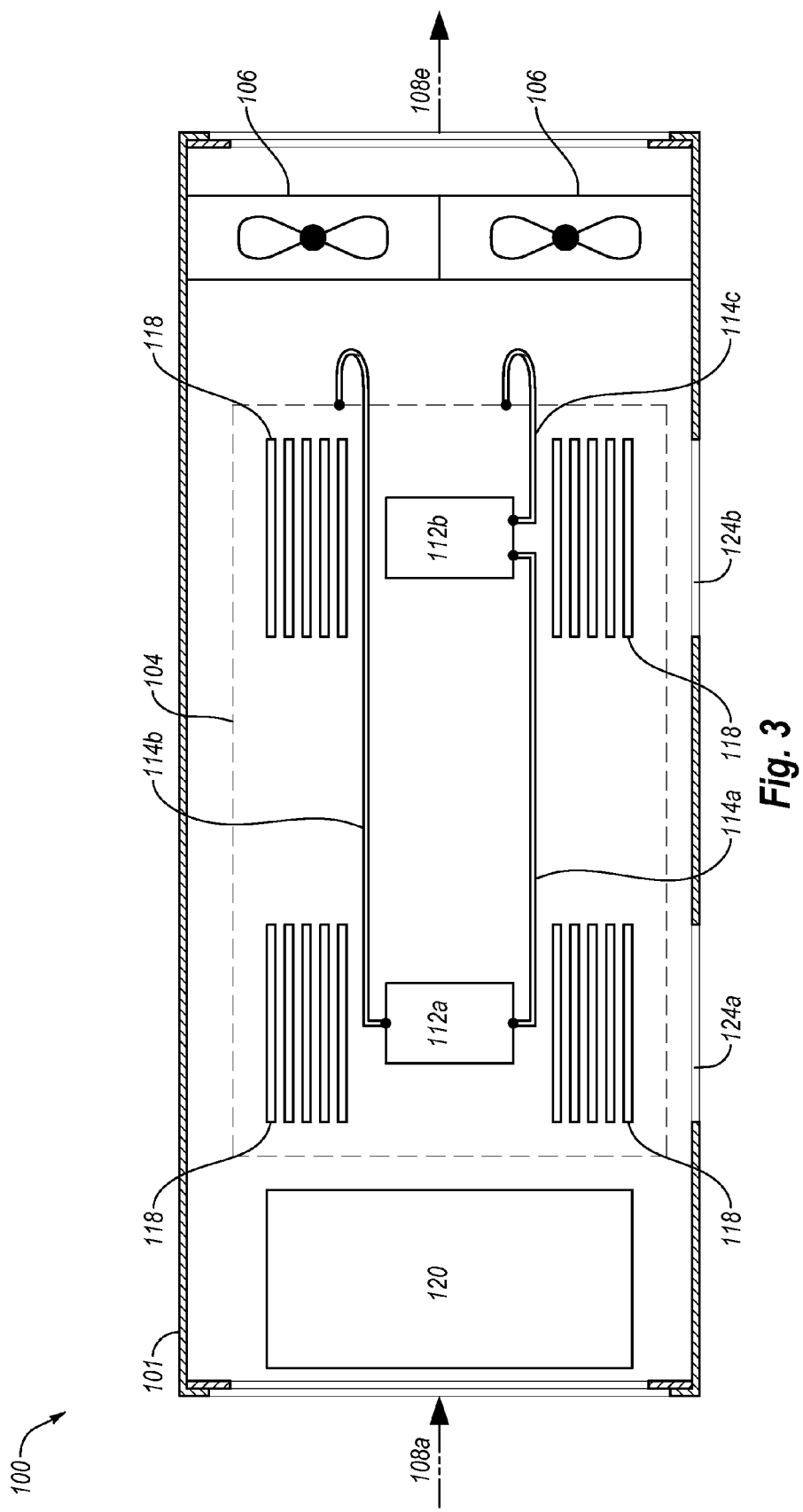
FIG. 3 illustrates a top schematic view of a server device in accordance with one or more embodiments described herein.

In one or more alternative embodiments, the server device 100 can include two or more fans 106 to move air through the chassis 101 (see, for example, FIG. 3). For example, the server device 100 may include any number of fans positioned throughout the chassis 101 (e.g., toward the first and/or second end of the chassis). For example, an embodiment of the server device 100 may include one or more fans 106 positioned proximate the inlet 102a and one or more fans 106 positioned proximate the outlet 102b to create airflow from the inlet 102a to the outlet 102b. Additionally, a fan 106 can be positioned above the radiator block 104 (e.g., approximately above baffle 110c).

In one or more embodiments, the one or more fans 106 may be variable speed fans for adjusting the volumetric flow rate of airflow through the server device 100. For instance, the fan 106 can communicatively couple to a thermocouple that measures a temperature of one or more electronic components within the server device 100. For example, the fan 106 can directly or indirectly couple to a thermocouple that measures and communicates the temperature of one or more of the processors 116a, 116b. The fan 106 speed, and thus the volumetric flow rate of the airflow, can be controlled based on the temperature of one or more of the processors 116a, 116b. In particular, the higher the measured temperature of the one or more processors 116a, 116b, the faster the fan 106 speed.

Likewise, the pumps controlling the flow rate of the cooling liquid through the liquid cooling loop can be communicatively coupled to a thermocouple that measures and communicates the temperature of one or more of the processors 116a, 116b. Alternatively, the pumps can be communicatively coupled to the fan 106, and the rate at which the pumps pump the cooling liquid can be coordinated with the speed of the fan 106. For example, the faster the speed of the fan 106, the higher the rate at which the pumps cause the cooling liquid to flow through the liquid cooling loop. Various formulas, associations, and controls can be part of controlling the fan speed and/or pump rate of the cooling liquid based on the temperature of one or more electronic components. In one or more embodiments, the cooling system can include a controller that controls one or more variable properties (e.g., fan speed, pump rate) of the cooling system based on one or more inputs (e.g., temperature, processor usage).

Notwithstanding the various fan 106 characteristics, the radiator block 104 can be oriented and positioned to create various airflow paths that can provide one or more benefits compared to conventional cooling systems. For example, and as illustrated in FIG. 1, the radiator block 104 can be positioned above the electronic components and oriented substantially horizontal within the server device (i.e., parallel to the motherboard 122). In one or more embodiments, the radiator block 104 is supported on a shelf that is connected to the chassis 101, as illustrated by the rectangular shelves below the radiator block in FIG. 1. For example, the shelf may include one or more tabs extending out from the interior sidewall of the chassis 101, as illustrated in FIG. 1.

In alternative embodiments, the radiator block 104 may be oriented at an angle with respect to the motherboard 122. For example, a first end of the radiator block 104 (e.g., the end closest to the inlet 102a) may be lower than a second end of the radiator block 104 (e.g., the end closest the outlet 102b). Thus, the radiator block 104 may be slanted upward between the inlet 102a and outlet 102b of the chassis 101. Orienting the radiator block 104 in this manner may facilitate airflow path 108 that passes through the radiator block 104 while air is routed through the server device 100. In an alternative embodiment, the radiator block 104 can be slanted downward between the inlet 102a and the outlet 102b (e.g., slanted opposite to the slant described above).

The angle at which the radiator block 104 can be slanted from horizontal (e.g., parallel with the motherboard 122 illustrated in FIG. 1) can range from about zero to about sixty degrees in either direction from horizontal. More particularly, the slant angle can range from about twenty to forty degrees in either direction from horizontal. One or more alternative embodiments can include various additional slant angles depending on the overall configuration of the server device 100.

Due to the position and orientation of the radiator block 104 shown in FIG. 1, the surface area of the radiator block 104 is increased substantially compared to if the radiator block were to be oriented vertically (i.e., perpendicular to the motherboard 122). The increased surface area of the radiator block 104 allows for an increased amount of heat transfer from the cooling liquid to the radiator block 104. Likewise, the increased surface area of the radiator block 104 allows for an increased amount of heat transfer to take place per volume of air that passes through the air passageways of the radiator block 104. Thus, positioning and orienting the radiator block 104 horizontally above the electronic components provides for an increase in the efficiency of the cooling system, while maintaining a compact design of the server device 100.

In addition to the increased surface area, the position and orientation of the radiator block 104 can further provide one or more airflow path configurations through the server device 100. For example, and as illustrated in FIG. 1, the server device 100 can further include a plurality of baffles 110 (i.e., 110a, 110b, and 110c) for routing air through the air passageways of the radiator block 104 as the airflow path 108 flows from the inlet 102a toward the outlet 102b of the server device 100.

The baffle 110 material can vary from one embodiment to the next. In one or more embodiments, the baffles can be made from a flexible material, such as a rubber or bendable plastic. Alternatively, the baffles can be made from a substantially rigid piece of material, such as a metal or rigid plastic. In any event, the baffles 110 can be made from any material that substantially blocks the airflow from flowing pass the baffle, thus allowing the baffles 110 to define an airflow path 108 through the server device 100.

In addition to the various baffle 110 materials, the number and positions of baffles 110 can vary to provide various airflow characteristics within the server device 100. In one or more examples, and as illustrated in FIG. 1, the first baffle 110a is positioned on the interior side of the chassis cover 103 to direct the airflow toward the bottom side of the radiator block 104. The server device 100 can include a second baffle 110b also positioned on the interior side of the chassis cover 103 to again direct the airflow toward the bottom side of the radiator block 104. Alternatively, the baffles 110a and 110b can be structurally coupled to the interior sidewalls of the chassis 101 and not coupled to the chassis cover 103.

Furthermore, the server device 100 can include a third baffle 110c that can be positioned on the interior surface of the bottom of the chassis 101 at a position between the first baffle 110a and the second baffle 110b. In one or more embodiments, the third baffle 110c can couple to the radiator device, or alternatively, can couple to a portion of the motherboard 122. In addition, the third baffle 110c can include one or more partitions that allow one or more liquid tubes 114 to pass through the third baffle 110c. It is appreciated that the server device 100 may include more or less baffles 110, and that the baffles 110 can be arranged and/or positioned to direct the airflow path 108 through the server device 100. Additional examples of baffle configurations in accordance with principles described herein are described below in connection with FIGS. 4-6.

Due to the position and orientation of the radiator block 104, and the configuration of the baffles 110, one or more airflow paths 108 can be defined within the server device 100. In particular, the airflow path 108 can be strategically defined to facilitate effective cooling of one or more electrical components within the server device 100, as well as efficient cooling of the radiator block 104. Although one or more airflow paths 108 can have various airflow directions throughout the server device 100, an initial airflow direction can be defined based on the inlet 102a and the outlet 102b. For example, and as illustrated in FIG. 1, the initial airflow path 108a can be defined as the direction directly from the inlet 102a towards the outlet 102b. In particular, FIG. 1 shows that the initial airflow direction is substantially parallel to the motherboard 122.

In one or more embodiments, the radiator block 104 can be oriented horizontally along a length of the chassis 101 such that the air passageways of the radiator block 104 are oriented substantially orthogonal to the initial direction of the airflow path 108a. For example, and as illustrated in FIG. 1, the initial airflow path 108a can enter the inlet 102a of the server device 100 moving in a substantially horizontal direction. Furthermore, as illustrated in FIG. 1, the air passageways within the radiator block 104 are oriented in a substantially vertical orientation. Thus, as the airflow path 108 moves from the inlet 102a to the outlet 102b, the airflow path 108 can change directions to flow through the radiator block 104. As described herein, substantially orthogonal means plus or minus ten degrees from an orthogonal angle.

Due to the orientation of the radiator block 104 in combination with the baffles 110a, 110b, and 110c, the airflow path 108 can cross the radiator block 104 multiple times prior to exiting the server device 100 through the outlet 102b. FIG. 1 illustrates one example embodiment that includes an airflow path 108 (i.e., 108a-108e) that crosses the radiator block 104 two times. In one or more embodiments, the airflow path 108 can cross the radiator block 104 more or less than two times, as will be further discussed below.

In addition to crossing the radiator block 104 multiple times, the airflow path 108 can also include various other characteristics. For example, the airflow path 108 can have various portions that provide a cooling effect to one or more parts of the server device 100. For example, the baffle 110a can direct an initial airflow path portion 108a toward the bottom side of the radiator block 104 (e.g., under the radiator block 104). As the initial airflow path portion 108a continues on toward the direction of the outlet 102b, the initial airflow path portion 108a can cause airflow to convectively cool one or more electronic components. For example, and as illustrated in FIG. 1, the initial airflow path portion 108a can convectively cool storage devices 120 as the airflow passes over and around the storage devices 120.

Moreover, the airflow path 108 can include a second airflow path portion 108b. As illustrated in FIG. 1, the second airflow path portion 108b can convectively cool memory circuitry 118 and/or other components housed within the portion of the server device 100 along the second airflow path portion 108b. As shown in FIG. 1, the second airflow path portion 108b eventually starts to turn upward toward the radiator block 104. In particular, because of baffle 110c, the airflow is forced upward through the radiator block 104.

Additionally, the airflow path 108 can include a third airflow path portion 108c that is directed through the radiator block 104. In particular, and as illustrated in FIG. 1, the third airflow path portion 108c can be directed through air passageways of the radiator block 104 for cooling the radiator block 104 and other components of the server device 100 coupled to the radiator block 104. As the airflow follows the airflow path portion 108c through the air passageways, heat from the radiator block 104 is transferred to the airflow. The airflow then can interact with the chassis cover 103, after which the airflow path portion 108c begins to turn back toward the outlet 102b of the server device 100.

The airflow path 108 is then affected by the baffle 110b, which forces the airflow path 108 back through the radiator block 104, as illustrated in FIG. 1. For example, a fourth airflow path portion 108d can be directed back through the radiator block 104. In particular, the fourth airflow path portion 108d may be directed through air passageways of the radiator block 104. As the airflow follows the fourth airflow path portion 108d through the flow passageways of the radiator block 104, additional heat from the radiator block 104 is transferred to the airflow. Upon leaving the air passageways of the radiator block 104, the fourth airflow path portion 108d starts to turn back toward the outlet 102b of the chassis 101.

The airflow path 108 can be further defined by a fifth airflow path portion 108e that passes through one or more electronic components, for example, memory circuitry 118 as illustrated in FIG. 1. The fifth airflow path portion 108e can then pass through the fan 106 and out the outlet 102b of the chassis 101. In one or more embodiments, the fifth airflow path portion 108e exits the server device into a hot aisle of a server room.

As illustrated in FIG. 1, the airflow path 108 can be strategically directed though the radiator block 104 to allow for increased heat transfer between the radiator block 104 and the airflow. For instance, the amount of heat transfer from the radiator block 104 and the airflow can be determined based on the mass flow rate of the air, the temperature difference between the air and the radiator block 104, and the heat capacity of the air. In particular, the higher the mass flow rate of the air, the greater the heat transfer between from the radiator block 104 and the air. Likewise, the larger the temperature difference between the temperature of the radiator block 104 and the temperature of the air, the greater the heat transfer between the radiator block 104 and the air.

In order to transfer the an increased amount of heat from the radiator block 104 to the air, the temperature difference between the temperature of the air and the temperature of the radiator block 104 can be maximized each time the airflow path 108 crosses the radiator block 104. Thus, as illustrated in FIG. 1, the cooling liquid can be introduced into the radiator on the end of the radiator block 104 closest to the outlet 102b. Due to the cooling liquid entering the radiator block 104 on the end closest to the outlet 102b, the radiator block 104 can have a temperature gradient going from a high temperature to a low temperature moving from the right of the radiator block 104 to the left of the radiator block 104. Thus, in one or more embodiments, in order to increase heat transfer to the air, colder air can be passed through the colder portions of the radiator block 104, and warmer air can be passed through the warmer portions of the radiator block 104.

FIG. 1 illustrates that colder air (e.g., air that has recently entered the server device 108) passes through the left side (e.g., colder side) of the radiator block 104. In particular, airflow path portion 108c passes through the left side of the radiator block 104. Due to the air at the airflow path portion 108c still being relatively cool, the difference in temperatures between the air and the left side of the radiator block is increased, and thus, the amount of heat transfer that takes place as the airflow passes through the radiator block 104 the first time is also increased.

After the air passes through the radiator block 104 the first time, the air has now increased in temperature. FIG. 1 illustrates, however, that the airflow path portion 108c can pass through the right side (e.g., warmer side) of the radiator block 104. Thus, even though the air passing through the radiator block 104 along the airflow path portion 108c is warmer, the fact that the right side of the radiator block 104 is also warmer can increase the amount of heat transfer from the radiator block 104 to the air as the airflow passes through the radiator block for the second time. Therefore, not only does passing the airflow through the radiator block 104 several times increase the amount of heat transfer from the radiator block 104 to the air, but the sequence in when the airflow path 108 passes through the radiator block 104 can further increase the amount of heat transfer from the radiator block 104 to the air.

One will appreciate in light of the disclosure herein that the cooling system of the server device 100 can provide numerous benefits with regard to efficiently cooling electronic components of the server device 100. Increasing the surface area of the radiator block 104, and directing the airflow path 108 through the radiator block 104 multiple times can increase the effectiveness of the cooling system. In turn, the cooling system can more efficiently and effectively cool the electronic components of the server device 100.

Figure 2:
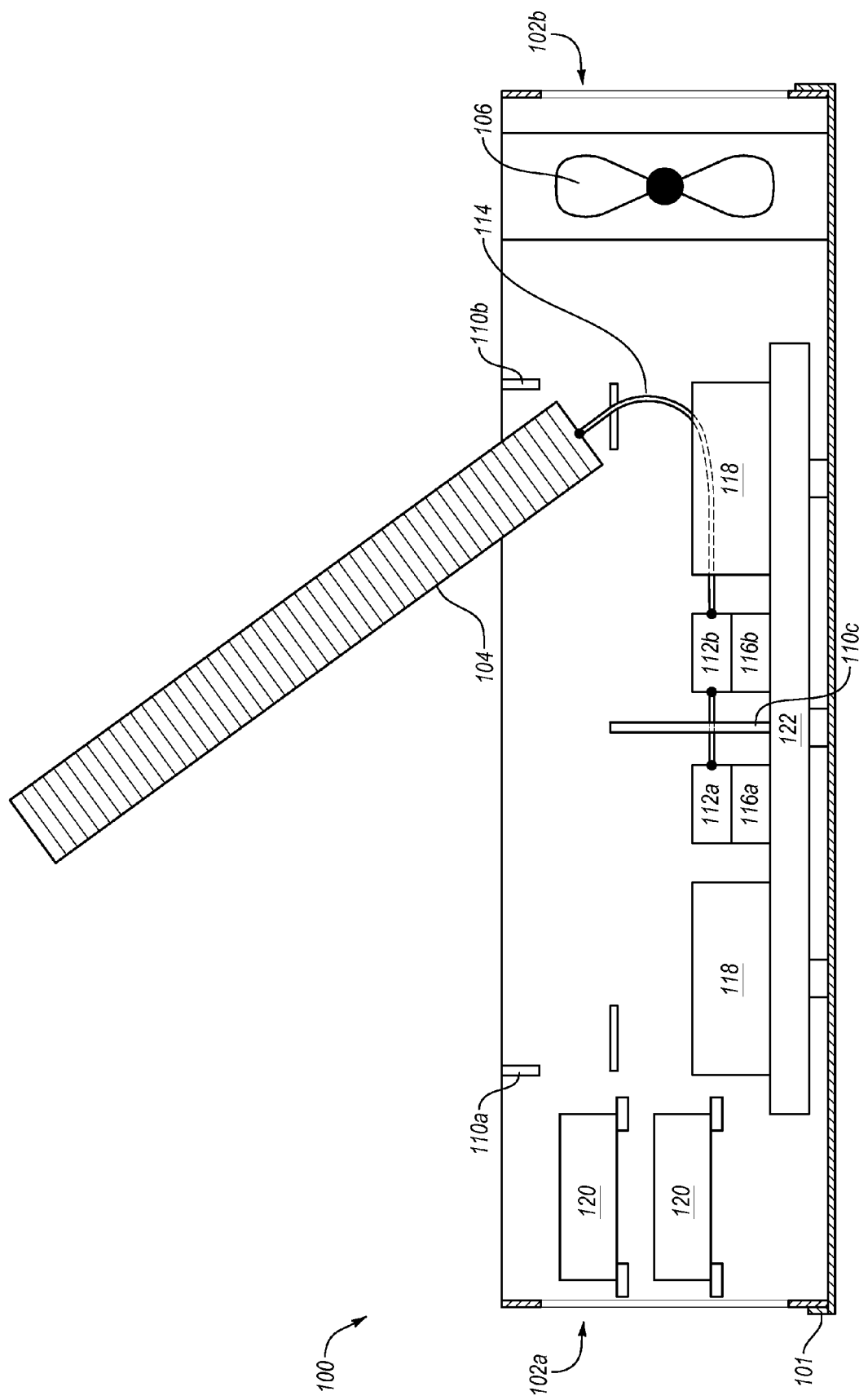
FIG. 2 illustrates the server device of FIG. 1 in an open position in accordance with one or more embodiments described herein.

Regardless of the increased performance and efficiency of the cooling system, as discussed in detail above, the cooling system can include one or more features that allow a technician to easily access one or more electronic components within the server device 100. For example, FIG. 2 illustrates a side schematic view of one example of a server device 100 with a radiator block 104 in an open position in accordance with principles described herein. In particular, FIG. 2 may illustrate one or more embodiments of the server device 100 described above in connection with FIG. 1, and thus like reference numerals of FIG. 2 may refer to elements of similar structure or function described above in connection with FIG. 1.

As illustrated in FIG. 2, a technician can remove the chassis cover 103. The technician can then manipulate or otherwise move the radiator block 104 to gain access to one or more electronic components within the server device 100. In particular, the liquid tubes 114 may facilitate rotation and/or displacement of the radiator block 104 for providing physical access to components within the server device 100, as illustrated in FIG. 2. For instance, the liquid tubes 114 can be made from a flexible material that allows the technician to manipulate the position of the radiator block 104. Thus, the radiator block 104 and liquid tubes 114 may be strategically arranged to facilitate easy access to components of the server device 100 for ease in troubleshooting and/or replacing parts of the server device 100.

As illustrated in FIG. 2, the radiator block 104 may be rotated around the end of the radiator block 104 connected to the liquid tubes 114. In this way, the liquid tubes 114 can provide a flexible structure to allow the radiator block 104 to move. In particular, the liquid tubes 114 can be made of flexible tubing that is bendable. Thus, without disconnecting the radiator block 104 from the liquid tubes, the radiator block 104 can be rotated or otherwise moved (e.g., opened) to obtain physical access to components within the server device 100. In addition to the foregoing, it is appreciated that the server device 100 can further include a hinge mechanism coupled with the radiator block 104, as will be discussed in further detail in FIGS. 4A-4B.

In order to provide additional details regarding the liquid cooling loop, FIG. 3 illustrates a top schematic view a server device 100 in accordance with one or more embodiments. In particular, FIG. 3 illustrates one or more embodiments of the server device 100 described above in connection with FIGS. 1-2. For convenience in the discussion that follows, and not to be construed as limiting, it is noted that like reference numerals of FIG. 3 may refer to elements of similar structure or function described above in connection with FIG. 1.

In particular, FIG. 3 illustrates additional detail of the liquid cooling components within the cooling system of server device 100. For example, and as was described above, the cooling system may include one or more cooling plates 112a, 112b. The cooling plates 112a, 112b may be positioned on top of or next to one or more processing components of the server device 100 (see, for example, FIG. 1). The cooling plates 112 can be thermally coupled to the radiator block 104 by a cooling liquid that is pumped from the cooling plates 112a, 112b, through liquid tubes 114 and into the radiator block 104.

The cooling system may be arranged in a variety of configurations. For example, one or more cooling plates 112 may be connected in a series configuration. As illustrated in FIG. 3, the cooling plate 112a is connected to the cooling plate 112b via liquid tube portion 114a. Additionally, liquid tube portion 114b may connect cooling plate 112b to the radiator block 104, as shown in FIG. 3. After being pumped through the radiator block 104, liquid tube portion 114c can return the cooling liquid back to the cooling plate 112a, thus completing the liquid cooling loop. A series configuration can provide a level of simplicity in that the cooling system can include a single liquid cooling loop.

In one or more alternative embodiments, the one or more cooling plates 112 may be connected in a parallel configuration. For example, the cooling plate 112a and the cooling plate 112b can be connected directly to the radiator block 104 via two separate liquid cooling loops. In particular, each cooling plate 112a and 112b can be associated with their own liquid cooling loop. In a parallel configuration, cooling plate 112a can have cooling liquid pumped via liquid tubes 114 through a first flow path passing through a portion of the radiator block 104 and back into the cooling plate 112a. Similarly, the cooling plate 112b can have cooling liquid pumped via liquid tubes 114 through a second flow path through a portion of the radiator block 104 and back into the cooling plate 112b.

A parallel configuration can be useful in applications in which an electronic component (e.g., an overclocked processor) requires more extensive cooling. For example, a parallel configuration provides each cooling plate 112 with a separate liquid cooling loop. Thus, in one or more embodiments, only the particular electronic component thermally coupled to the cooling plate 112 transfers heat into the cooling liquid, which provides for a higher rate of heat exchange from the electronic component, to the cooling plate 112, and to the cooling liquid. In contrast, a series configuration can have two or more electronic components transferring heat into the same liquid cooling loop.

In one or more alternative embodiments, one or more server devices 100 can be coupled together by way of liquid tubes 114 such that a liquid cooling loop extends through two or more server devices. For example, after the cooling liquid is cooled within radiator block 104, the cooling liquid can be pumped via liquid tubes 114 to another server device and through cooling plates included within the other server device. In this way, various components can be used more efficiently throughout a server system. For example, instead of having one or more pumps per server device 100, a server system can have a single pump for a single liquid cooling loop that pumps cooling liquid through several server devices.

Additionally, one or more server devices can share more than one liquid cooling loops. For example, two liquid cooling loops can be used through several server devices, each loop coupled to one cooling plate within each device. In this way, a server system can receive the benefits of a parallel liquid cooling loop configuration on a per device level, and at the same time receive the hardware efficiencies of a serial liquid cooling loop configuration on a system level.

In addition to the configuration of the liquid cooling loop, FIG. 3 further illustrates that the chassis 101 may include one or more side openings 124 for providing access to various components within the server device 100. For example, the chassis 101 may include a first side opening 124a and a second side opening 124b. The first side opening 124a may provide physical access to memory circuitry 118 and processor 116a, while the second side opening 124b may provide physical access to additional memory circuitry 118 and processor 116b. Additional or fewer side openings 124 may be used. For instance, the chassis 101 may include four or more side openings 124 for obtaining physical access to each of the illustrated memory circuitry 118 positioned throughout the chassis 101. In some embodiments, side openings 124 may be accessible through sliding or hinged doors that may be opened for gaining access to components within the server device 100, and closed for preventing obstruction of an airflow path 108 through the chassis 101 when the server device 100 is in operation.

Figure 4A:
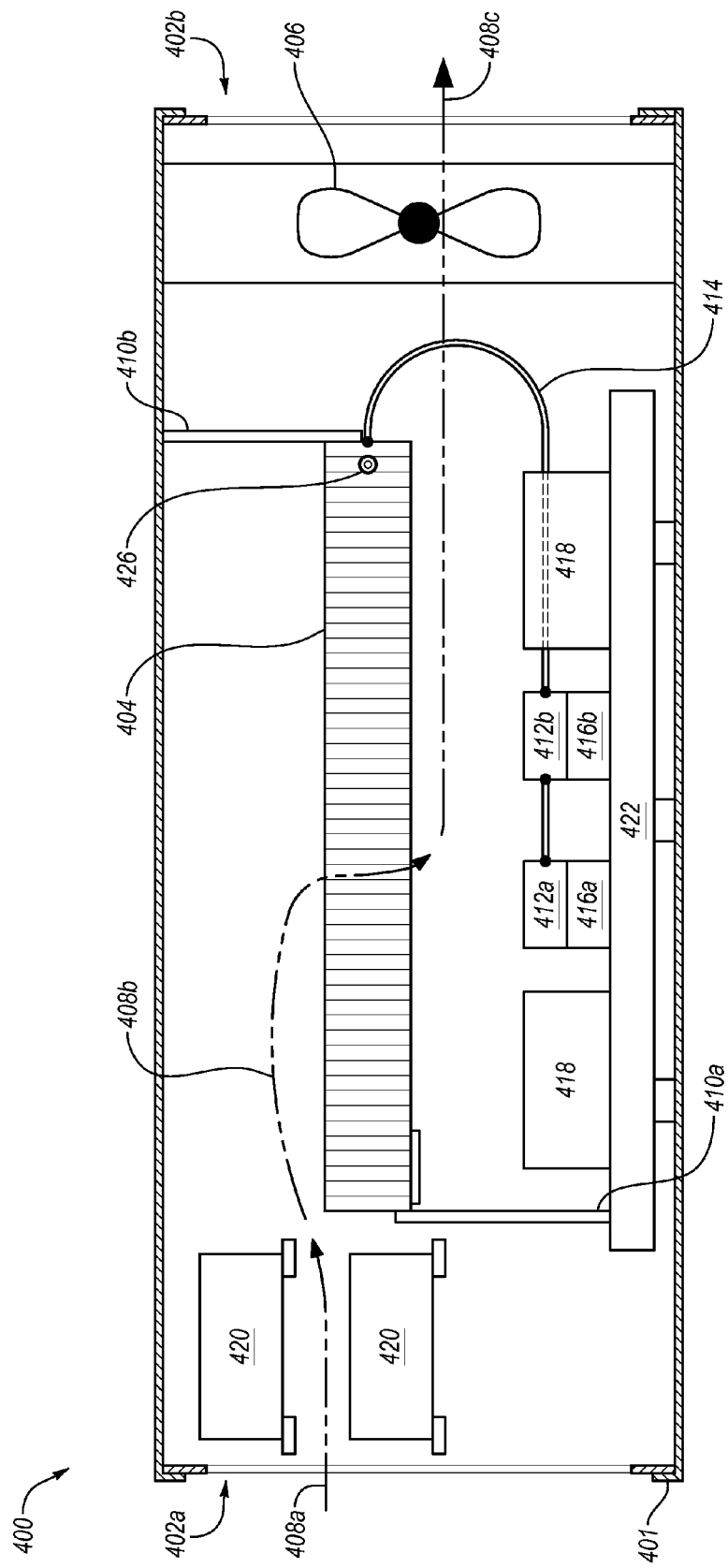
FIG. 4A illustrates a side schematic view of a server device in accordance with one or more embodiments described herein.

FIG. 4A illustrates a side view of another example of a server device 400 in accordance with principles describer herein. The server device 400 can include similar structure and functionality as described with respect to the server device 100 in connection with FIG. 1. Similar to the server device 100 of FIG. 1, the server device 400 can include a chassis 401, a radiator block 404, one or more fans 406, a plurality of baffles 410, one or more cooling plates 412, cooling tubes 414, one or more processors 416, memory circuitry 418, storage devices 420, and one or more motherboards 422. One or more of the above listed components can be similar to components described above in connection with FIG. 1.

As illustrated in FIG. 4A, one or more embodiments of the server device 400 can include a single pass airflow path configuration. In particular, the airflow path 408 only passes through the radiator block 404 one time. In such an embodiment, the radiator block 404 can be oriented such that air passageways on the radiator block 404 are substantially orthogonal to an initial direction of airflow 408a passing from an inlet 402a to an outlet 402b of the server device 400. The orientation and position of the radiator block 406 can allow for a radiator block 406 with a larger surface area, which in turn can increase heat transfer efficiency between the radiator block 404 and the airflow.

Additionally, one or more baffles 410 can be oriented to direct air through the radiator block 404 as the airflow path 408 passes from the inlet 402a to the outlet 402b. In one or more embodiments, a first baffle 410a can be positioned toward the bottom of the first end of the chassis 401 while a second baffle 410b can be positioned toward the top of the second end of the chassis 401.

In one embodiment, an initial airflow path portion 408a can enter an inlet 402a of the chassis 401 for cooling storage devices 420 as air passes along the initial airflow path portion 408a. The first baffle 410a can direct the initial airflow path portion 408a over the first baffle 410a so that air passing through the chassis 401 passes over a top surface of the radiator block 404. A second airflow path portion 408b can pass over the top surface of the radiator block 404 and through air passageways of the radiator block 404. Airflow passing along the second airflow path portion 408b can cool the radiator block 404. A third airflow path portion 408c can pass under the radiator block 404 over one or more cooling plates 412, processors 416, and memory circuitry 418 for cooling the cooling plates 412, processors 416, and memory circuitry 418 as air passes along the third airflow path portion 408c. The third airflow path portion 408c can then exit the server device 400 through the outlet 402b at the second end of the chassis 401.

In one or more embodiments, the server device 400 can include a hinge pin 426 around which the radiator block 404 rotates. For example, as illustrated in FIG. 4A, the hinge pin 426 can rotatably couple to an interior sidewall of the chassis 401 and provide a pivot point around which the radiator block 404 can rotate. For instance, the radiator block 404 can include pins on one end of the radiator block 404 that interface with the sidewalls of the chassis 401 so that the radiator block 104 can rotate about the pins. In one or more embodiments that include a rigid second baffle 410b, the hinge pin 426 can rotatably couple the second baffle 410b to the sidewall of the chassis 401 around which second baffle 410b and the radiator block 404 can rotate.

Figure 4B:
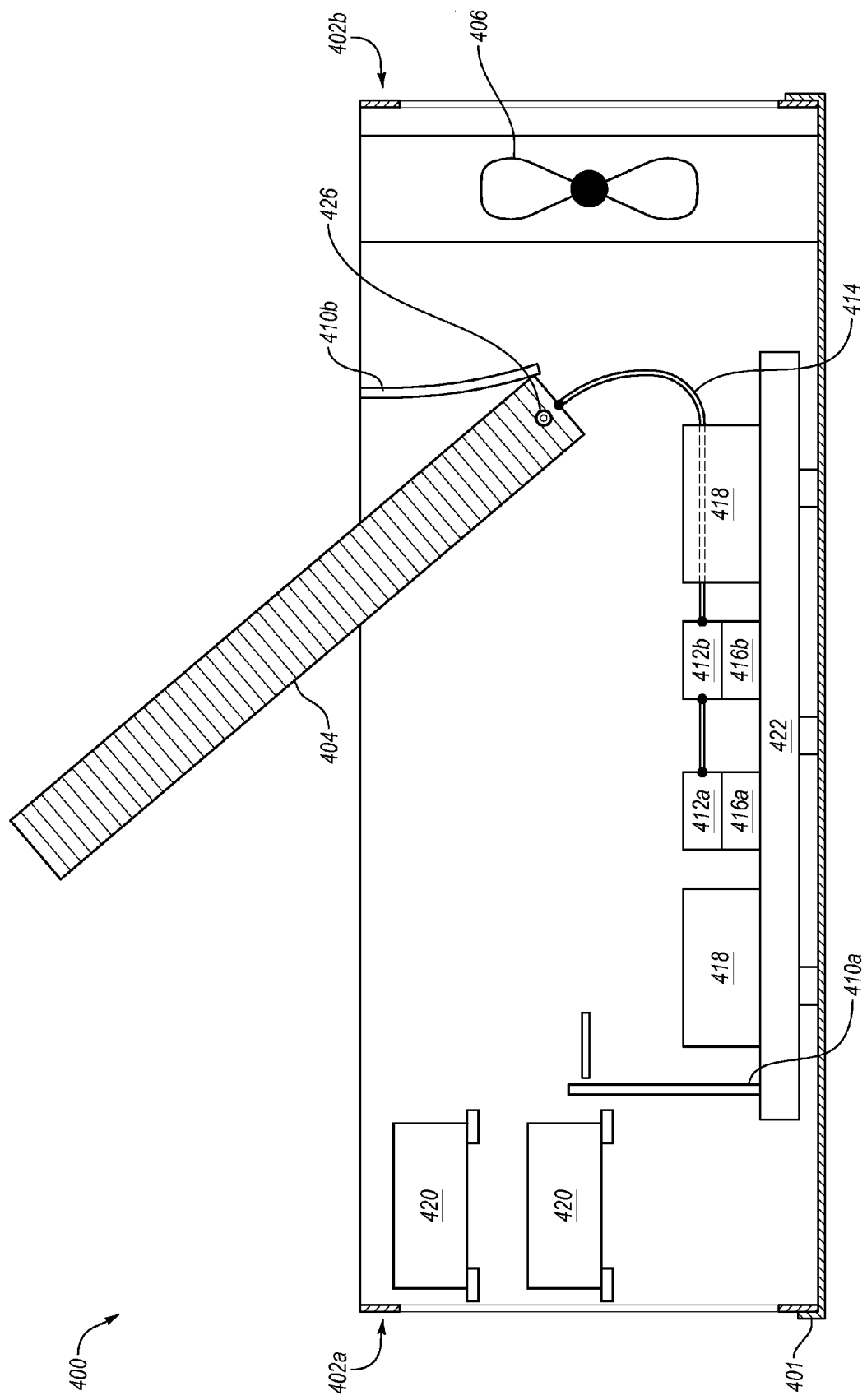
FIG. 4B illustrates the server device of FIG. 4A in an open position in accordance with one or more embodiments described herein.

FIG. 4B illustrates a side schematic view of one or more embodiments of the server device 400 with the radiator block 404 in an open position in accordance with principles described herein. As shown in FIG. 4B, the radiator block 404 can rotate around a hinge pin 426. As the radiator block 404 rotates, the second baffle 410b can flex to provide clearance for the radiator block 404 to rotate upward as shown. In one or more embodiments, the radiator block 404 can rotate to a vertical position with respect to the chassis 401. Additionally, the radiator block 404 can rotate past a vertical position with respect to the chassis 401, which in turn provides potentially increased access to one or more of the electronic components. In addition, and as illustrated in FIG. 4B, upon rotation of the radiator block 104, the first baffle 410a can separate from the radiator block 404. For example, the first baffle 410a can couple to a portion of the motherboard 122, or alternatively, the first baffle 410a can couple to a portion of the chassis 401. In one or more additional embodiments, the first baffle 410a can be coupled to the radiator block 404 but designed to contact the motherboard when the radiator block 404 is in an operating position and orientation. In such an embodiment, when the radiator block 404 rotates, the first baffle 410a rotates with the radiator block 404.

Figure 5A:
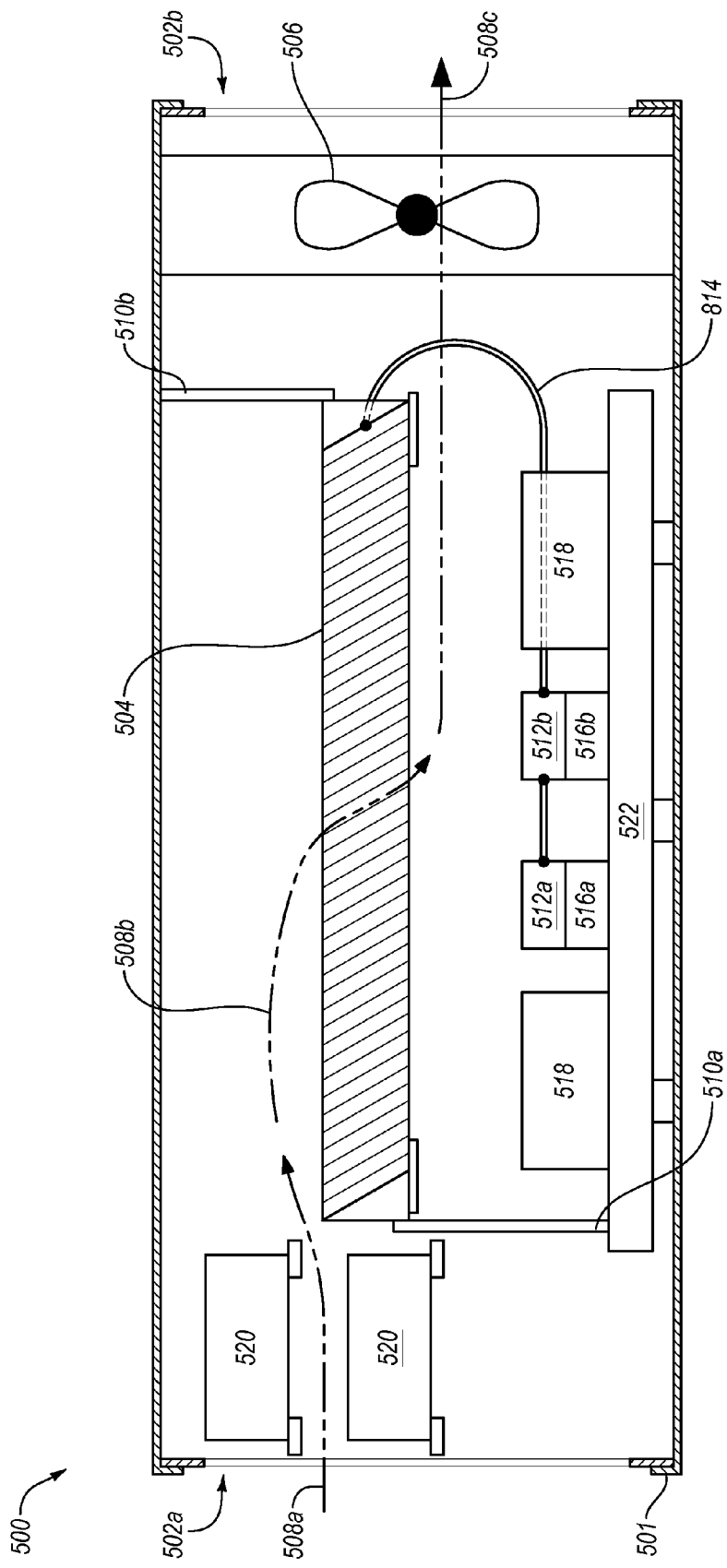
FIG. 5A illustrates a side schematic view of a server device in accordance with one or more embodiments described herein.

FIG. 5A illustrates a side schematic view of a server device 500 in accordance with one or more embodiments described herein. The server device 500 can include similar structure and functionality as the server device 100 described above in connection with FIG. 1. Similar to the server device 100 of FIG. 1, the server device 500 can include a chassis 501, a radiator block 504, one or more fans 506, a plurality of baffles 510, one or more cooling plates 512, liquid tubes 514, one or more processors 516, memory circuitry 518, storage devices 520, and one or more motherboards 522. One or more of the above listed components can be similar to components described above in connection with other FIG. 1.

In addition to the various configurations described above, FIG. 5A-5A illustrates that the radiator block 504 can include air passageways that are at an angle with respect to the orientation of the radiator block 504. For example, and as illustrated in FIG. 5A, each of the air passageways of the radiator block 504 can be slanted downward from the inlet 502a toward the outlet 502b according to a direction of the air passing between a top surface of the radiator block 504 and a bottom surface of the radiator block 504, and further based on the direction of the airflow path 508a, 508b, and 508c from the inlet 502a toward the outlet 508b. In one or more alternative embodiments, when airflow is directed from below the radiator block 504, through air passageways, and out the top of the radiator block 504, the air passageways of the radiator block 504 can be slanted upward from the inlet 502a toward the outlet 502b based on the direction of airflow passing through the radiator block 504. Orienting the air passageways of the radiator block 504 in this manner can facilitate an airflow that passes through the radiator block 504 with minimal change of direction, providing a potentially more efficient airflow throughout the server device 500.

The angle of the air passageways within the radiator block 504 can vary from one embodiment to the next. For example, the angle at which the air passageways within the radiator block 504 are angled can vary based on volume flow rate of the air, the position and orientation of the radiator block 504, and the desired airflow path 508. For example, in one or more embodiments that include an airflow path 508 that passes through the radiator block 504 multiple times (e.g., similar to illustrated embodiments of FIG. 1), air passageways can be oriented using a plurality of different angles within the same radiator block 504. In particular, a first half of the radiator block 504 closest to the first end (e.g., inlet 502a) of the chassis 501 can include a first plurality of air passageways slanted upward from the inlet 502a toward the outlet 502b. In contrast, a second half of the radiator block 504 closest to the second end (e.g., outlet 502b) of the chassis 501 can include a second plurality of air passageways slanted downward from the inlet 502a toward the outlet 502b. Alternatively, or additionally, the air passageways within the radiator block 504 can be oriented at varying angles based on the position of the air passageways along the radiator block 504.

Figure 5B:
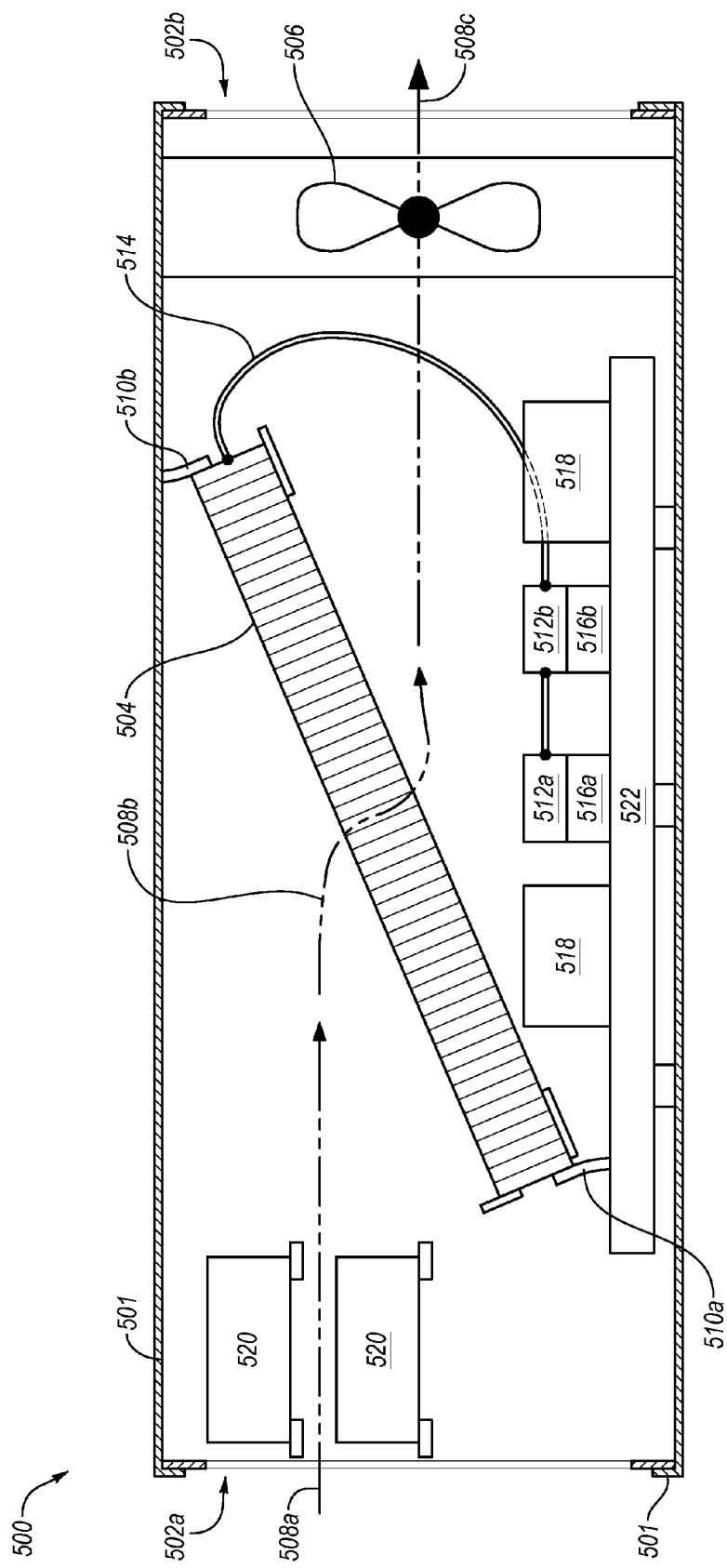
FIG. 5B illustrates a side schematic view of a server device in accordance with one or more embodiments described herein.

FIG. 5B illustrates a side view of one example of a server device 500 in accordance with one embodiment of principles described herein. The server device 500 can include similar structure and functionality as the server device 500 described above in connection with FIG. 5A. Similar to FIG. 5A, FIG. 5B illustrates the airflow path 508a, 508b, and 508c that passes through the radiator block 504 at an angle relative to the initial direction of airflow path 508a. As shown in FIG. 5B, the radiator block 504 can have an orientation and position such that the air passageways within the radiator block 504 are also oriented at an angle to more efficiently allow the airflow to pass through the radiator block 504 with minimal change of direction as the airflows between the inlet 502a and the outlet 502b of the server device 500. Positioning and orienting the air passageways within the radiator block 504 at an angle may result in a more efficient airflow through the server device 500, and thus increase the effectiveness of the cooling system within the server device 500.

In addition, FIG. 5B illustrates that the baffles 510a and 510b can have a position, orientation, and dimension such that the baffles are in a biased flexed position when the radiator block 104 is in an operating position. The biased position of the baffles 510a, and 510b can provide a tighter seal between the baffles 510a and 510b, which in turn provides for a better defined and controlled airflow path through the server device 100. In one or more embodiments, the biased baffles 510a and 510b can also provide a support structure support the radiator block 504. For example, upon providing a sufficient amount of force to bias or flex the baffles 510a and 510b to position the radiator block 504, the baffles 510a and 510b can provide sufficient force upon the radiator block 504 to maintain the radiator block 504 in position.

The embodiments can be embodied in other specific forms without departing from its spirit or essential characteristics. The described embodiments are to be considered in all respects only as illustrative and not restrictive. For example, the methods described herein can be performed with less or more steps/acts or the steps/acts can be performed in differing orders. Additionally, the steps/acts described herein may be repeated or performed in parallel with one another or in parallel with different instances of the same or similar steps/acts. The scope of the embodiments is, therefore, indicated by the appended claims rather than by the foregoing description. All changes that come within the meaning and range of equivalency of the claims are to be embraced within their scope.

What is claimed is:

1. A server device, comprising:
an elongated chassis having a first end and a second end;
one or more fans positioned within the elongated chassis to draw air in an initial direction from the first end and towards the second end, the initial direction corresponding to a flow direction of the one or more fans;
a radiator block having a first end and a second end, the radiator block being oriented substantially parallel to the flow direction of the one or more fans, the radiator block comprising a plurality of air passageways through which the air passes, the plurality of air passageways being orientated substantially orthogonal to the initial direction;
a first baffle in contact with the first end of the radiator block to re-direct air from the initial direction through the plurality of air passageways in a direction orthogonal to the initial direction;
a second baffle in contact with the radiator block to re-direct air passing through the plurality of air passageways back to the initial direction and towards the second end of the elongated chassis;
one or more cold plates; and
one or more liquid tubes that couple the one or more cold plates to the radiator block.

2. The server device of claim 1, further comprising one or more additional baffles that further direct an airflow path through the elongated chassis.

3. The server device of claim 1, wherein the first baffle and the second baffle are each coupled to the elongated chassis.

4. The server device of claim 1, wherein the first baffle and the second baffle direct the airflow path through the radiator block one time as the airflow path passes between the first end and the second end of the elongated chassis.

5. The server device of claim 2, wherein the first baffle, second baffle, and one or more additional baffles direct the airflow path through the radiator block multiple times as the airflow path passes between the first end and the second end of the elongated chassis.

6. The server device of claim 5, further comprising a third baffle in contact with the radiator block.

7. The server device of claim 1, wherein the first baffle and the second baffle comprise a first flexible baffle and a second flexible baffle.

8. The server device of claim 1, wherein the first baffle and second baffle direct the airflow path through the elongated chassis when the first baffle and second baffle.

9. The server device of claim 1, wherein the radiator block comprises a movable radiator block coupled to one or more components within the elongated chassis, wherein the movable radiator block moves to provide access to the one or more components without decoupling from the liquid tubes.

10. The server device of claim 1, further comprising a hinge pin around which the radiator block rotates.

11. The server device of claim 10, wherein the hinge pin extends from an interior sidewall of the elongated chassis to an opposing interior sidewall of the elongated chassis.

12. The server device of claim 1, wherein the radiator block further comprises:
an operating position having an airflow path that passes through the radiator block; and
an open position wherein the radiator block is rotated about a hinge.

13. The server device of claim 1, wherein the server device further comprises one or more side access openings on the elongated chassis to grant access to one or more component of the server device positioned between the radiator block and a motherboard.

14. A server device, comprising:
an elongated chassis having a first end and a second end;
a radiator block positioned within the elongated chassis between the first end and the second end;
one or more cold plates;
one or more liquid tubes connecting the one or more cold plates to the radiator block;
one or more fans positioned within the elongated chassis to draw air from the first end through a length of the chassis and towards the second end; and
a plurality of baffles that define an airflow path that passes through the radiator block two or more times as the airflow path passes through the chassis from the first end towards the second end.

15. The server device of claim 14, wherein the radiator block comprises a plurality of air passageways through which the airflow path passes that are oriented substantially orthogonal to an initial direction from the first end and towards the second end.

16. The server device of claim 14, wherein the radiator block comprises a plurality of air passageways through which the airflow path passes that are oriented at an angle between the first end and towards the second end of the elongated chassis.

17. The server device of claim 14, wherein the radiator block is slanted upward between the first end and the second end of the elongated chassis.

18. The server device of claim 14, wherein the radiator block further comprises:
a first end of the radiator block;
a second end of the radiator block; and
a plurality of air passageways through which the airflow path passes that are oriented at an angle relative to a direction defined from the first end of the radiator block and the second end of the radiator block.

19. The server device of claim 18, wherein the plurality of air passageways are oriented at a plurality of different angles within the radiator block.

* * * * *